United States Patent [19]

Miyakawa et al.

[11] Patent Number: 4,790,632
[45] Date of Patent: Dec. 13, 1988

[54] LIQUID CRYSTAL DEVICE HAVING THE MICROLENSES IN CORRESPONDENCE WITH THE PIXEL ELECTRODES

[75] Inventors: Tadashi Miyakawa; Kazuhiko Yanagihara; Hisao Oishi; Tsunehiko Takahashi, all of Kaisei-Machi; Takeshi Nakamura, Osaka; Kazuhiko Akimoto, Osaka; Mitsuaki Shioji, Osaka, all of Japan

[73] Assignees: Fuji Photo Film Co., Ltd., Kanagawa; Sharp Kabushiki Kaisha, Osaka, both of Japan

[21] Appl. No.: 84,232

[22] Filed: Aug. 11, 1987

[30] Foreign Application Priority Data

Aug. 12, 1986 [JP] Japan .................. 61-189207

[51] Int. Cl.⁴ .................................... G02F 1/13
[52] U.S. Cl. .................. 350/347 V; 350/334; 350/342
[58] Field of Search ............ 350/334, 342, 345, 338, 350/339 F

[56] References Cited

U.S. PATENT DOCUMENTS

| 4,263,594 | 4/1981 | Masucci | 350/345 |
| 4,866,519 | 8/1987 | Yoshida et al. | 350/345 |

FOREIGN PATENT DOCUMENTS

| 0083814 | 5/1983 | Japan | 350/334 |
| 0165621 | 8/1985 | Japan | 350/342 |
| 0043730 | 5/1986 | Japan | 350/345 |

Primary Examiner—Stanley D. Miller
Assistant Examiner—Huy K. Mai
Attorney, Agent, or Firm—Sughrue, Mion, Zinn, Macpeak & Seas

[57] ABSTRACT

For recording an image on a photosensitive material with the employment of a liquid crystal device, the device used therein is conventionally constructed so as to modulate an amount of light rays transmitted therethrough or reflected thereby commonly by the control of an amount of electric voltage impressed to the liquid crystal device and/or impression timing or frequencies thereof. In this instance, although the light rays irradiated are considered normally as parallel, they are not intact strictly parallel light rays, and consequently unless the light rays transmitted from the device are converged by Selfoc lens arrays and the like, sufficient resolution can hardly be obtained on the photosensitive material on account of the light rays still having comparatively large diffusion coefficients. Since the liquid crystal device made in accordance with this invention is provided with its own image formation abilities, contact exposure with the photosensitive material is possible, and image formation optical systems which have been used in conjunction with the device is safely and advantageously eliminated, whereby parallelism limitations imposed on the irradiated rays can be reduced, and optical mechanisms therefor could be compact and have remarkably improved efficiencies.

10 Claims, 4 Drawing Sheets

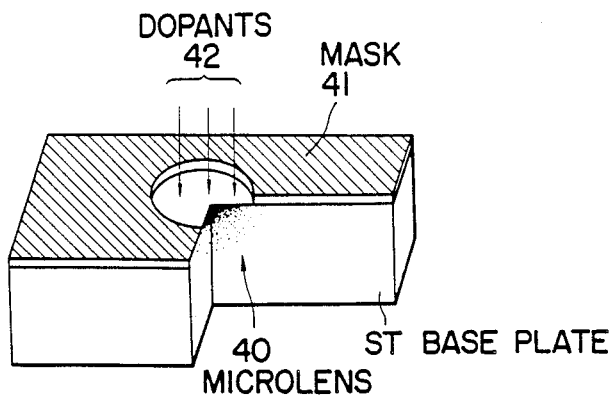
F I G. 4
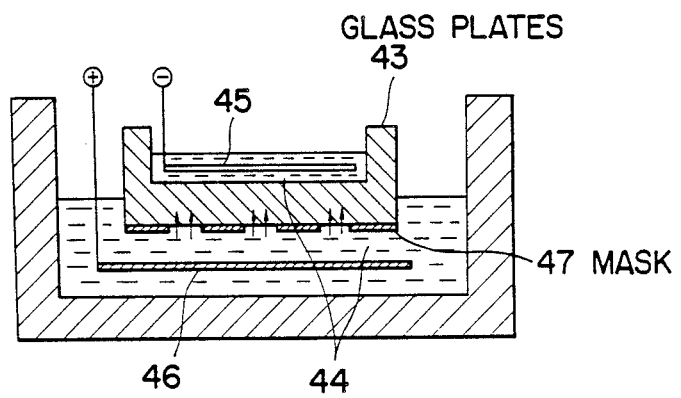
F I G. 5

LIQUID CRYSTAL DEVICE HAVING THE
MICROLENSES IN CORRESPONDENCE WITH
THE PIXEL ELECTRODES

BACKGROUND OF THE INVENTION

1. Field of the Invention

This invention relates to a liquid crystal device which can be utilized, for example, as a liquid crystal optical shutter, and more particularly, to a structure of such a liquid crystal device which is constructed so as to modulate a quantity of light transmitted through or reflected from the liquid crystal device by way of controlling the level and/or timing, or frequency of an electric voltage applied to the liquid crystal device.

2. Description of the Prior Art

When an image is recorded on a photosensitive material by using a liquid crystal device, the recording has conventionally been made in a manner as shown in FIG. 1 of the accompanying drawings, as prior art. There, parallel light rays 1 are irradiated onto a liquid crystal device 10, being controlled in accordance with image signals, and the parallel light rays 1 which are in turn subjected by the liquid crystal device 10 to an on-off control or shutter control are imaged on a photosensitive material 30 through a Selfoc lens array 20 ( Selfoc lens is a trade name of a refractive index distributed lens manufactured by Nihon Itagarasu Kabushiki Kaisha in Japan ) so that an image is recorded on the photosensitive material 30. The liquid crystal device 10 employed there consists of a liquid crystal 11 filled in a space between orientation diaphragms 12A and 12B which are faced to each other with a predetermined distance such as 6μ therebetween. In one of the orientation diaphragms 12B, a plurality of pixel electrodes 13 of a predetermined size and made from a transparent material are embedded with predetermined distances therebetween, which form picture elements of the liquid crystal device 10 under a predetermined arrangement, while to the another orientation diaphragm 12A there are embedded a plurality of photomasks 17 for shading at locations anti correlated to the pixel electrodes 13. There are provided outside of the diaphragm 12A and in a layer a common electrode 14 which is formed with a transparent material. To the outside of the common electrode 14, there is provided a transparent base plate 15A made from glass and likewise, to the outside of the diaphragm 12B, there is provided a transparent base plate 15B. To the outsides of the transparent base plates 15A and 15B, there are provided respectively in a layer a polarizing plate 16A and a polarizing plate 16B. With reference to FIG. 1, it shall be noted that the parallel light rays 1 are shown there with extremely large incident angles so as to indicate that the rays 1 are not strictly parallel to each other.

As explained above, when the parallel light rays 1 are subjected to shutter control by the liquid crystal device 10 and are recorded on the photosensitive material 30 and images are formed by each picture element, the parallel light rays 1, which should have been made parallel to each other, are not so in a strict sense. Therefore, unless the rays emitted from the liquid crystal device 10 are converged by the Selfoc lens array 20 as an image formation means, they are diffused too widely to have a good resolution on the photosensitive material 30. In order to avoid such wide diffusion, the recording has been made commonly by interposing the Selfoc lens array 20 and the like between the liquid crystal array 10 and the photosensitive material 30. However, such interposition makes an optical system bulky and makes its optical utilization efficiencies poor.

SUMMARY OF THE INVENTION

In view of the above-described background, it is a principle object of this invention to provide a liquid crystal device which has an image formation ability by itself, and by which an image can be recorded directly without the employment of any other optical system.

According to one aspect of this invention, for achieving the objects described above, there is provided a liquid crystal device comprising a liquid crystal filled in a space between a sequence of pixel electrodes and a common electrodes facing to each other with said space therebetween, a pair of base plates sandwiching said pixel and common electrodes, and polarizing plates each placed in a layer outside of the base plates. The invention is characterized in that microlenses are provided to at least one of the base plates in correspondence with the pixel electrodes for converging light rays irradiated onto the pixel electrodes for the image formation thereby.

The nature, principle and utility of the invention will become more apparent from the following detailed description when read in conjunction with the accompanying drawings.

BRIEF DESCRIPTION OF THE DRAWINGS

In the accompanying drawings:

FIGS. 3 and 4 are explanatory perspective views showing microlenses and a manufacturing method thereof;

FIG. 5 is an explanatory cross-sectional view showing a substantive manufacturing method of the microlens;

DESCRIPTION OF THE PREFERRED EMBODIMENTS

Figure 1:
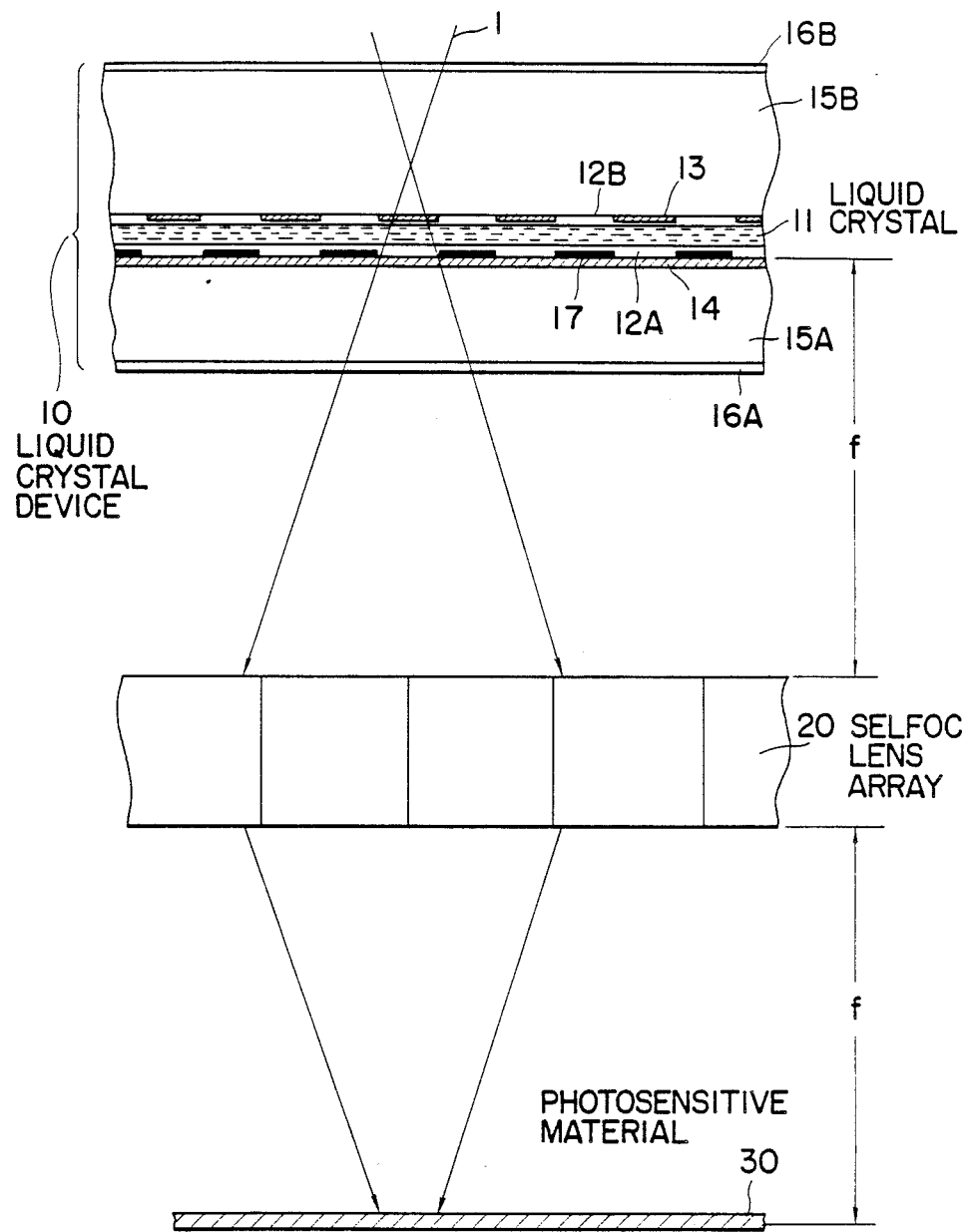
FIG. 1 is an explanatory view showing a conventional liquid crystal device and its manner of recording.
Figure 2:
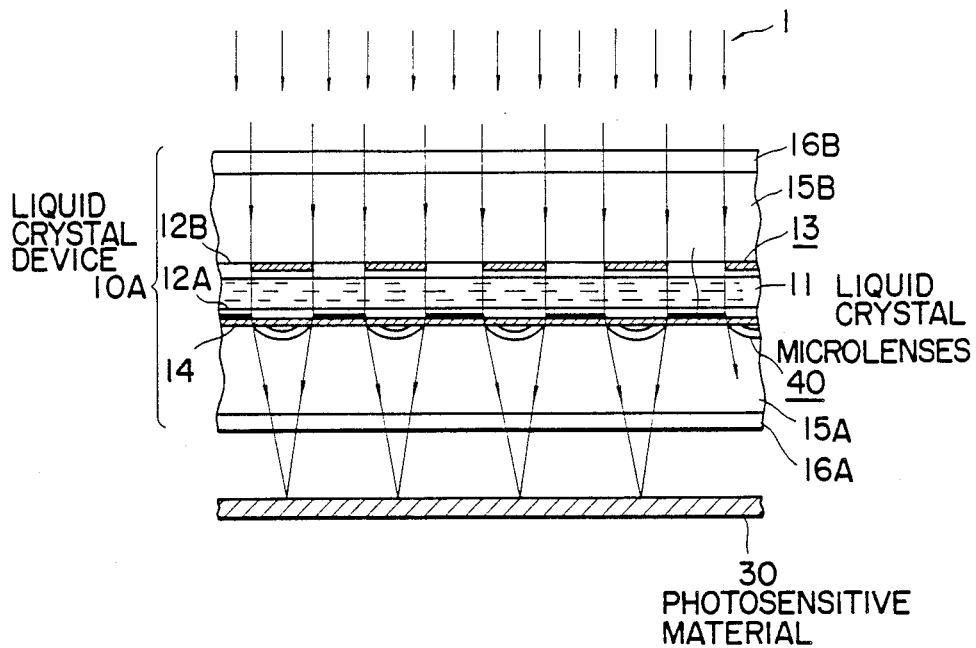
FIG. 2 is a cross-sectional view showing structures of an embodiment of the liquid crystal device made in accordance with this invention.

In this invention as shown in FIG. 2, there are operatively provided microlenses 40 within a transparent base plate 15A so that they abut the common electrode 14 and face against respective pixel electrodes 13. On account of such arrangement that the microlenses 40 are provided to each picture element in the path of transmission of light through the transparent base plate 15A, the liquid crystal device 10A comes to have an image formation ability by itself. Accordingly, when the focal lengths of the respective microlenses 40 are made equal with respect to each pciture element, an image can be formed on the photosensitive material 30 directly by the shutter control of the parallel light rays 1, thus enabling the recording of the image without the interposition of conventional optical systems having an image formation ability such as a Selfoc lens array.

FIGS. 3 to 6 show the structure of such microlenses 40 and a method for making them.

Figure 3:
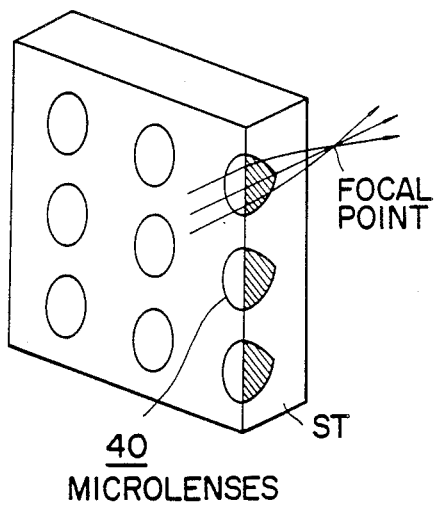

The microlenses 40 of a flat plate shape as shown by FIG. 3 can be manufactured by the employment of planar technology well known in the semiconductor field. As shown in FIG. 4, a surface of a base plate ST of the microlens 40 to which is applied a mask 41, is contacted over its entire surface with dopants 42 of a high refractive index so that the dopants 42 are diffused into the base plate ST selectively in accordance with patterns of the mask 41 for producing desired functions selectively and locally within the base plate ST. By utilizing this technology in the manufacture of lenses, the microlenses 40 of two dimensional arrays as shown in FIG. 3 can be manufactured collectively in one unit.

More specifically, the dopants 42 which increase a refractive index of the base plate ST, are diffused from openings of the mask 41. In a commercial production, the infiltration of dopants is accelerated when an electric field is employed since they are ions. The density of the dopants 42 thus diffused into the base plate ST has the highest density at the surface of the base plate ST. In other words, the density is highest at the center of the opening of the mask 41, and it gradually decreases as it goes deeper and towards radial directions outward from the center. Since a refractive index increases in proportion to a density of the dopants 42, the distribution of the refractive index of the microlens 40 decreases in proportion with an increase of depth and distance towards the outer radial directions. Therefore, the rays irradiated onto the microlens 40 are refracted to turn towards the center of the opening of the mask 41 of the base plate ST. Hence, when a distribution of the refractive index of the base plate ST is properly controlled, the lenses of small aberration can readily be obtained.

In the manufacture of the microlenses of a one- or two-dimensional array by the planar technology, a plastic diffusion polymerization method, an ion exchange diffusion method or an ion electric field infiltration method is also applicable, and lithography, an etching method and so on which are widely utilized in electronic industries can also be combined in the above manufacture. Materials for the microlenses could be selected almost freely so far as they meet the purpose, and can be glass, quartz, plastic and other crystalline substances including semiconductive materials.

This invention is achieved therefore, by the production of the microlenses 40 within the transparent base plate 15A (or 15B) by the above-described processes, when the liquid crystal device 10 is constructed and assembled.

Figure 6:
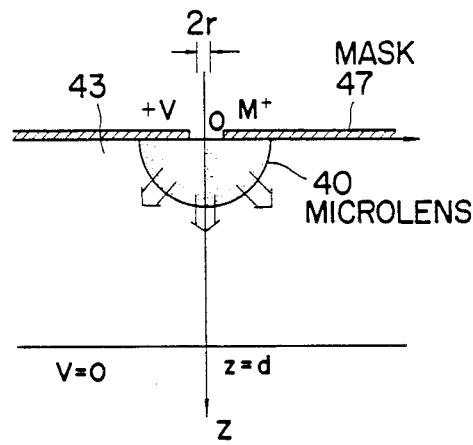
FIG. 6 is a view for the explanation of stages of the formation of the microlens.

With reference to FIGS. 5 and 6, the above-described manufacturing processes or methods are further described below in more concrete ways. FIG. 5 shows an electric field infiltration method, in which a glass plate 43 as a base plate is immersed in a molten salt 44. The glass plate 43 has an amorphous reticulate structures of $Si_2O_2$ in which monoatomic and diatomic metallic ions exist as modification oxides which have respective electron polarizabilities inherent to each ion and which contribute to the refractive index of the glass plate 43. The monoatomic metallic ions in the glass plate 43 increase their diffusion coefficients and mobility when the glass plate 43 is brought to a high temperature, and they start to move within the reticulate structures of the glass plate 43. This nature is utilized for forming in the glass plate 43 such distribution of the refractive index which works as a microlens. That is, such formation is achieved by substituting the above mobile monoatomic metallic ions with those ions having a different electron polarizability, resulting in obtaining a microlens by a selective electric field infiltration method which forms specific distributed index areas in the glass plate 43.

As illustrated in FIG. 5, the glass plate 43, one of the surfaces of which is treated with the mask 47, is placed in a bath having a positive electrode 46 so that the surfaces make contact with the molten salt 44, and so that those metallic ions of a high electron polarizability which are contained in the molten salt 44 and which contribute largely to the refractive index of the glass plate 43 are infiltrated from the openings of the mask 47. Thereby the metallic ions infiltrated into the glass disperse substantially along electric power lines while the metallic ions substituted by the infiltrated ions are charged out from the surface of the glass facing to a negative electrode 45 and into the molten salt 44 in which the negative electrode 45 is provided.

In connection with the selective electric field infiltration method described above, a working model such as illustrated in FIG. 6 could be established, in which the center of the mask 47 on the surface of the glass plate 43 is made as an origin 0 of a cylindrical coordinate system in which a radial direction is expressed by r and a direction of depth by z. A radius of the mask 47 is r and a thickness of the glass plate 43 is d. To the opening of the mask 47, there is impressed an electric voltage V0, while the side of the negative electrode 45 is kept at $V=0$. Thus, the metallic ions infiltrated from the opening flow in the glass plate 43 on account of a drift caused by an electric field and on account of the diffusion by density gradients, resulting in producing a desired distribution of the refractive index which constitutes the microlens 40.

Figure 7:
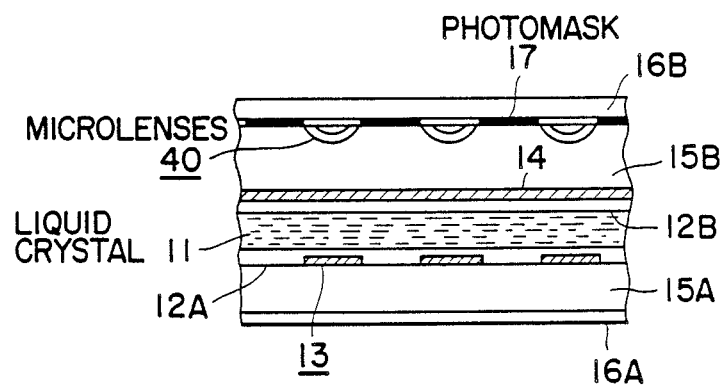
FIG. 7 is a cross-sectional view of another embodiment of the liquid crystal device made in accordance with this invention.

While in the embodiment described above, the microlenses 40 are formed at those portions of the transparent base plate 15A at the recording side which abut the common electrode 14, the microlenses 40 may be formed at portions which abut the polarizing plate 16A, or they may be formed at those inner intermediate portions of the transparent base plate 15A which made abutment neither with the common electrode 14 nor with the polarizing plate 16A. Or, as illustrated in FIG. 7, the microlenses 40 could be constituted within the transparent base plate 15B of the incident side. Or, the microlenses 40 may be formed in the transparent plate 15A of the recording side as well as the base plate 15B of the incident side. Or, the microlenses 40 may be formed on one of or both of the polarizing plate 16A and 16B, or within one of or both of the base plates 16A and 16B.

Since the liquid crystal device made in accordance with this invention provides its own image formation abilities, its contact exposure with a photosensitive material is possible, and image formation optical systems which have been used in conjunction with the liquid crystal device can be safely and advantageously eliminated, whereby parallelism limitations required to irradiated light could be moderated, and optical mechanisms therefor could be compact and improved remarkably of their efficiencies.

It should be understood that many modifications and adaptations of the invention will become apparent to those skilled in the art and it is intended to encompass such obvious modifications and changes in the scope of the claims appended hereto.

What is claimed is:

1. A liquid crystal device, comprising:

a liquid crystal filled in a space between an arrangement of pixel electrodes and a common electrode facing each other with said space therebetween;

a first base plate adjacent to said pixel electrodes and a second base plate adjacent to said common electrode, said first and second base plates sandwiching said pixel electrodes and said common electrode therebetween;

polarizing plates each placed in a respective layer on surfaces of respective ones of the base plates exterior to said pixel electrodes and to said common electrode; and a plurality of microlenses integrally formed in at least one of the base plates in correspondence with the pixel electrodes for converging light rays irradiated onto the pixel electrodes for the image formation thereby.

2. A liquid crystal device as claimed in claim 1, in which recording light passes from an incident side to a recording side of said device and the microlenses are formed in the base plate located on said recording side.

3. A liquid crystal device as claimed in claim 2, in which the microlenses are disposed adjacent to the common electrode.

4. A liquid crystal device as claimed in claim 2, in which the recording light passes from an incident side to a recording side of said device and the microlenses are disposed adjacent to the polarizing plate on said recording side.

5. A liquid crystal device as claimd in claim 2, in which recording light passes from an incident side to a recording side of said device and the microlenses are disposed away from the common electrode and away from the polarizing plate on said recording side.

6. A liquid crystal device as claimed in claim 1, in which recording light passes from an incident side to a recording side of said device and the microlenses are formed in the base plate at said incident side.

7. A liquid crystal device, comprising:

a liquid crystal filled in a space between an arrangement of pixel electrodes and a common electrode facing each other with said space therebetween;

a pair of base plates sandwiching said pixel electrodes and said common electrode therebetween;

polarizing plates each placed in a respective layer on surfaces of respective ones of the base plates exterior to said pixel electrodes and said common electrode;

a plurality of microlenses disposed on at least one of the base plates in correspondence with the pixel electrodes for converging light rays irradiated onto the pixel electrodes for the image formation thereby;

wherein recording light passes from an incident side to a recording side of said device and the microlenses are formed on the base plate on said incident side; and further comprising a photomask provided on the base plate at the incident side, said photomask having openings corresponding to the pixel electrodes and located upon those portions of said base plate where the irradiated light rays are received.

8. A liquid crystal device as claimed in claim 7, in which the microlenses are disposed in positions facing the opening of the photomask.

9. A liquid crystal device as claimed in claim 1, wherein said microlenses comprise a distribution of a refractive index within said at least one base plate.

10. A liquid crystal device, comprising:

a liquid crystal filled in a space between an arrangement of pixel electrodes and a common electrode facing each other with said space therebetween;

a first base plate adjacent to said pixel electrodes and a second base plate adjacent to said common electrodes, said first and second base plate sandwiching said pixel electrodes and said common electrode therebetween;

polarizing plates each placed in a respective layer on surfaces of respective ones of the base plates exterior to said pixel electrodes and to said common electrode; and a plurality of microlenses integrally formed in a transparent plate arranged between one of said base plates and one of the polarizing plates.

* * * * *